(12) United States Patent
Kim

(10) Patent No.: US 7,923,307 B2
(45) Date of Patent: Apr. 12, 2011

(54) SEMICONDUCTOR DEVICE WITH FUSE AND METHOD FOR FABRICATING THE SAME

(75) Inventor: Buem-Suck Kim, Kyoungki-do (KR)

(73) Assignee: Hynix Semiconductor Inc., Ichon-si, Kyoungki-do (KR)

( * ) Notice: Subject to any disclaimer, the term of this patent is extended or adjusted under 35 U.S.C. 154(b) by 0 days.

(21) Appl. No.: 12/163,383

(22) Filed: Jun. 27, 2008

(65) Prior Publication Data

US 2009/0166803 A1    Jul. 2, 2009

(30) Foreign Application Priority Data

Dec. 27, 2007   (KR) .................. 10-2007-0138962

(51) Int. Cl.
*H01L 23/62* (2006.01)
(52) U.S. Cl. .. 438/132; 438/601; 257/529; 257/E21.001
(58) Field of Classification Search .................. 438/132, 438/601, 215, 281, 333, 467; 257/209, 529, 257/E21.001
See application file for complete search history.

(56) References Cited

U.S. PATENT DOCUMENTS

| | | | |
|---|---|---|---|
| 4,984,054 A * | 1/1991 | Yamada et al. ............... 257/529 |
| 5,636,172 A | 6/1997 | Prall et al. | |
| 6,057,221 A | 5/2000 | Bernstein et al. | |
| 6,337,507 B1 * | 1/2002 | Bohr et al. ................... 257/529 |
| 6,746,947 B2 * | 6/2004 | Daubenspeck et al. ....... 438/601 |
| 7,227,238 B2 * | 6/2007 | Ito et al. ...................... 257/529 |
| 2003/0151116 A1 * | 8/2003 | Cabral et al. ................ 257/532 |
| 2005/0285224 A1 * | 12/2005 | Tsutsui ........................ 257/531 |
| 2008/0185678 A1 * | 8/2008 | Kitajima ...................... 257/529 |
| 2009/0121314 A1 * | 5/2009 | Bosholm et al. ............. 257/529 |

FOREIGN PATENT DOCUMENTS

| | | | |
|---|---|---|---|
| JP | 56138947 A | * | 10/1981 |
| JP | 57109191 A | * | 7/1982 |
| JP | 02-0244740 | | 9/1990 |
| JP | 02-244740 | | 9/1990 |
| KR | 1998-058446 | | 10/1998 |
| KR | 1998058446 | * | 10/1998 |
| KR | 1020000003231 | | 1/2000 |
| KR | 1020000026808 | | 5/2000 |
| KR | 1020010089386 | | 6/2001 |
| KR | 10-2001-0089386 | | 10/2001 |

OTHER PUBLICATIONS

Korean Notice of Preliminary Rejection for Korean Application No. 10-2007-0138962.

* cited by examiner

*Primary Examiner* — Matthew S Smith
*Assistant Examiner* — Michele Fan
(74) *Attorney, Agent, or Firm* — Lowe Hauptman Ham & Berner LLP

(57) ABSTRACT

A method for fabricating a semiconductor with a fuse includes providing a substrate, forming an insulation layer over the substrate, forming a polysilicon hard mask over the insulation layer, forming a first mask pattern to form a fuse over the polysilicon hard mask, and removing the polysilicon hard mask exposed by the first mask pattern to form a portion of the polysilicon hard mask into a polysilicon fuse.

10 Claims, 6 Drawing Sheets

SEMICONDUCTOR DEVICE WITH FUSE AND METHOD FOR FABRICATING THE SAME

CROSS-REFERENCE TO RELATED APPLICATIONS

The present invention claims priority of Korean patent application number 2007-0138962, filed on Dec. 27, 2007, which is incorporated by reference in its entirety.

BACKGROUND OF THE INVENTION

The present invention relates to a method for fabricating semiconductor devices. More particularly, the present invention relates to a semiconductor device with a recess gate therein and a method for fabricating the same.

Generally, semiconductor memory devices are fabricated through a fabrication (FAB) process, for repeatedly forming circuit patterns set on a substrate to form cells with integrated circuits, and an assembly process, for packaging the substrate with the cells on a chip basis. Furthermore, an electrical die sorting (EDS) process for checking an electric characteristic of the cells over the substrate is performed between the above two processes.

Defective cells are sorted out through the EDS process. Prepared redundancy cells substitute for the sorted defective cells by a repair process. Thus, the chips normally operate and the throughput of the semiconductor memory device increases.

The repair process is performed by a fuse blowing method irradiating a laser beam onto a line connected to the defective cells to cut the line. The line cut by the laser beam is called a fuse. A portion surrounding the cut fuse is called a fuse portion. The fuse unit includes a fuse, an insulation layer over the fuse, and a fuse box formed by etching a portion of the insulation layer. The laser beam can be irradiated to the fuse box to cut the fuse. To successfully cut the fuse with the laser beam, it is required to properly adjust a thickness (Rox) of the insulation layer remaining over the fuse in the fuse box. That is, when the insulation layer remaining over the fuse is overly thick, explosive power of the fuse becomes increases. Thus, an adjacent fuse may be attacked or the substrate below the fuse may be cracked. When the insulation layer remaining over the fuse is overly thin, the fuse is not cut.

A typical fuse is formed using a polysilicon plate electrode of a capacitor in a cell region. However, as semiconductor devices are highly integrated and an electric characteristic of the semiconductor devices is secured, a three-layered metal line is formed instead of a typical two-layered metal line during a metal line formation process. Furthermore, an etch target increases during a formation of the fuse unit including the fuse formed using the polysilicon plate electrode. In the formation of the fuse unit, etch time and height difference increases. Thus, it is difficult to control the thickness (Rox) of the insulation layer remaining on the fuse.

Currently, a fuse is formed using a metal line. Hereinafter, the fuse formed using the metal line is called as a metal fuse. The metal fuse is disposed higher than the fuse formed using the polysilicon plate electrode. Thus, an etch target decreases when the insulation layer for forming a fuse box is etched.

However, since the metal fuse has a lower resistance than the polysilicon fuse, the thickness (Rox) of the metal fuse remaining on the metal fuse is less than that remaining on the fuse. That is, a range of the thickness (Rox) of the insulation layer remaining on the metal fuse is smaller than that remaining on using the polysilicon fuse. Thus, it is difficult to control the extent of etch during the formation of the fuse box and fabricate the semiconductor devices in mass.

Furthermore, the metal line and the metal fuse formed using the metal line does not include one material like the polysilicon fuse. That is, the metal line and the metal fuse formed using the metal line may have a stack structure of TiN/Al/TiN. Thus, defect occurrence possibility increases when the fuse using the laser beam is cut out. This is because the barrier metal layer below the metal fuse often protrudes during a metal etch process and insufficient energy is supplied to this protruded portion during a subsequent fuse blowing process, which thus remains as a residue.

SUMMARY OF THE INVENTION

Embodiments of the present invention are directed to providing a semiconductor with fuse and a method for fabricating the same.

In the embodiments of the present invention, a fuse is formed using a polysilicon hard mask for a metal contact. A fuse including only polysilicon is formed over a layer with a metal line thereon. Thus, fuse formation and repair processes can be easily performed. Furthermore, by etching edges of the fuse or performing an ion implantation process, resistance of the edges of the fuse increases. As a result, energy is focused on a central portion of the fuse during a repair process to stably perform a fuse blowing process.

In accordance with an aspect of the present invention, there is provided a method for fabricating a semiconductor with a fuse. The method includes providing a substrate, forming an insulation layer over the substrate, forming a polysilicon hard mask over the insulation layer, forming a first mask pattern to form a fuse over the polysilicon hard mask, and removing the polysilicon hard mask exposed by the first mask pattern to form a portion of the polysilicon hard mask into a polysilicon fuse.

In accordance with another aspect of the present invention, there is provided a semiconductor device with a fuse including a substrate employing an insulation layer thereon; a polysilicon fuse formed using a polysilicon hard mask for a metal contact over the insulation layer, an insulation layer covering the polysilicon fuse, and a fuse box for exposing a center portion of the polysilicon fuse while the insulation layer of the predetermined thickness remains on the polysilicon fuse.

In accordance with still another aspect of the present invention, there is provided a method for fabricating a semiconductor device with a fuse. The method includes providing a substrate, forming an insulation layer over the substrate, forming a fuse over the insulation layer, forming a mask pattern for exposing the edges of the fuse other than a region for a fuse box over the fuse, and etching the edges of the fuse exposed by the mask pattern or performing an ion implantation process to increase a resistance of the edges of the fuse.

In accordance with a further aspect of the present invention, there is provided a semiconductor device with a fuse including a substrate employing an insulation layer thereon, a fuse over the insulation layer, an insulation layer covering the fuse, and a fuse box disposed in the insulation layer and exposing a center portion of the fuse while having the insulation layer on the fuse to have a predetermined thickness.

DESCRIPTION OF SPECIFIC EMBODIMENTS

Embodiments of the present invention relate to a semiconductor with a fuse and a method for fabricating the same.

FIGS. 1A to 1I are cross-sectional views illustrating a method for fabricating a semiconductor device with a fuse in accordance with an embodiment of the present invention.

Figure 1A:
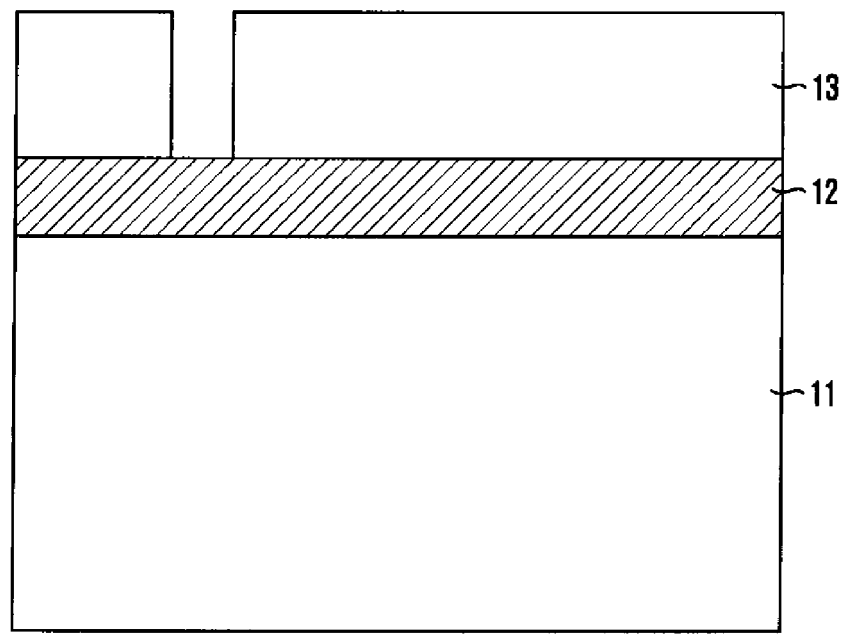
FIGS. 1A to 1I are cross-sectional views illustrating a method for fabricating a semiconductor device with a fuse in accordance with an embodiment of the present invention.

Referring to FIG. 1A, a first insulation layer 11 is formed over a substrate (not shown) with a predetermined structure. The insulation layer preferably includes an oxide-based thin film.

A polysilicon layer 12 for a hard mask is formed over the first insulation layer 11. The polysilicon layer 12 functions as an etch barrier in a subsequent first metal contact formation process. The polysilicon layer 12 is formed because the subsequent first metal contact is formed to penetrate the insulation layer 11. The first insulation layer 11 is formed to cover a capacitor (not shown) formed in a cell region and has a greater thickness. It is difficult to secure an etch margin during the etch process for forming the first metal contact penetrating the first insulation layer 11 only using a photoresist pattern. Therefore, a hard mask should be interposed below the photoresist pattern to perform the etch process.

In an embodiment of the present invention, the hard mask is the polysilicon layer 12. The polysilicon layer 12 functions as an etch barrier during the formation of the first metal contact and forms a subsequent fuse.

A first photoresist pattern 13 is formed over the polysilicon layer 12 to form the first metal contact.

Figure 1B:
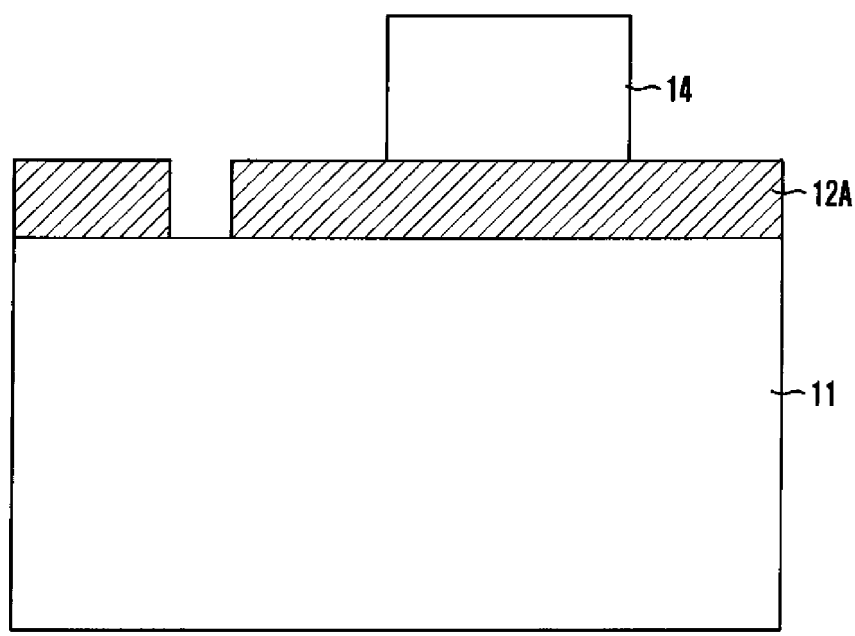

Referring to FIG. 1B, the polysilicon layer 12 is etched using the first photoresist pattern 13 as an etch barrier. Thus, a polysilicon pattern 12A is formed to expose a region for the first metal contact. Then, the first photoresist pattern 13 is removed and a second photoresist pattern 14 is formed to cover a region for a fuse.

Figure 1C:
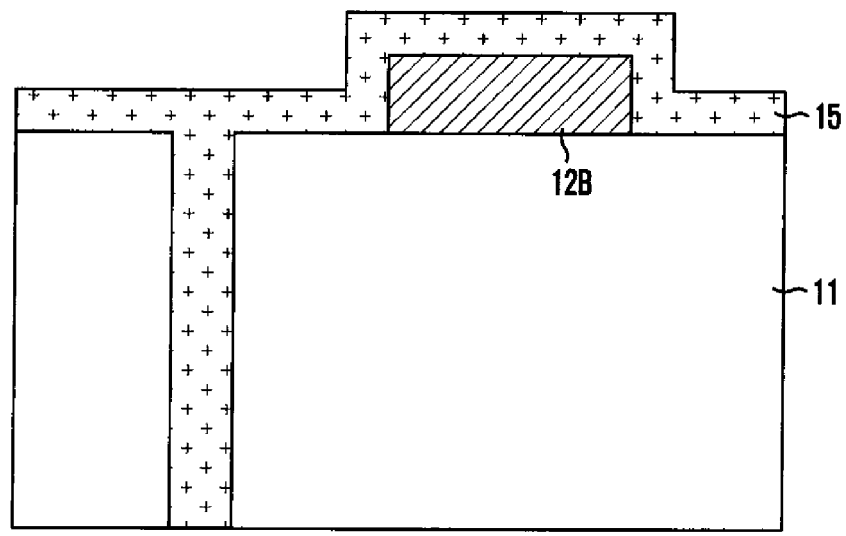

Referring to FIG. 1C, the exposed first insulation layer 11 is etched using the polysilicon pattern 12A as an etch barrier to form a contact hole. The contact hole exposes a predetermined portion of the substrate by penetrating through the insulation layer 11. Herein, the polysilicon pattern 12A can be damaged to a predetermined extent while a portion thereof below a second photoresist pattern 14 is protected.

The polysilicon pattern 12A is etched and then removed except a portion thereof below the second photoresist pattern 14. As a result, the polysilicon pattern 12A remains only in a region for the fuse to form a polysilicon fuse 12B.

The second photoresist pattern 14 is removed and a conductive layer 15 for a contact is formed over the resultant structure to sufficiently fill the contact hole. The conductive layer 15 may include a barrier metal layer, e.g., a titanium (TiN) layer, and a tungsten layer.

Figure 1D:
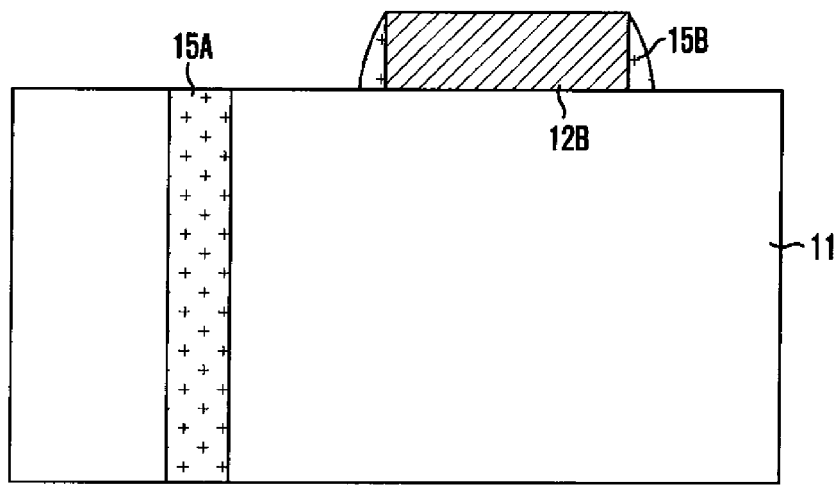

Referring to FIG. 1D, the conductive layer 15 is etchbacked until the first insulation 11 is exposed. Then, the conductive layer 15 in the contact hole forms a first metal contact 15A. The conductive layer 15 for a contact may remain on sidewalls of the polysilicon fuse 12B in a spacershape. The remaining conductive layer 15 is called a conductive pattern 15B. The conductive pattern 15B may be removed during an etch process for forming a subsequent metal line.

Figure 1E:
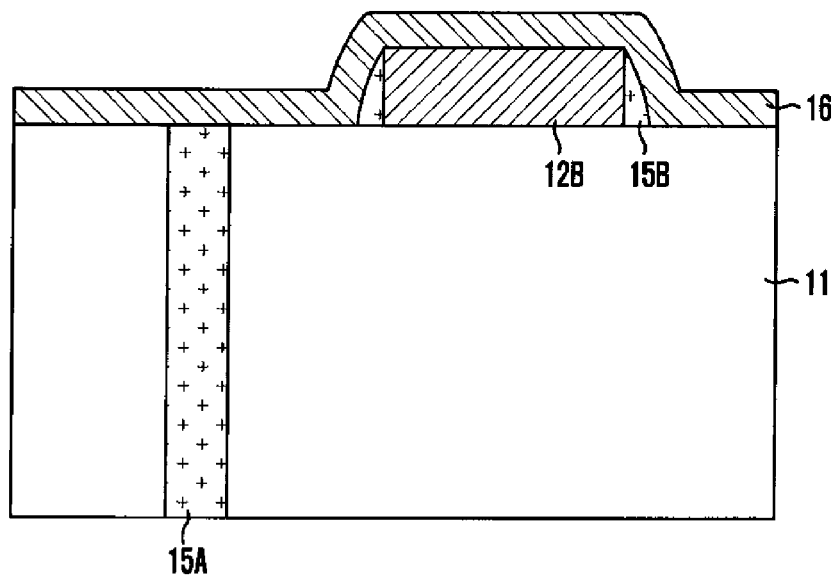

Referring to FIG. 1E, a metal layer 16 is formed over a resultant structure including the first metal contact 15A, the conductive pattern 15B, and to form the metal line and the polysilicon fuse 12B. The metal layer 16 preferably includes Aluminum (Al) and is formed thinner than the polysilicon fuse 12B.

Figure 1F:
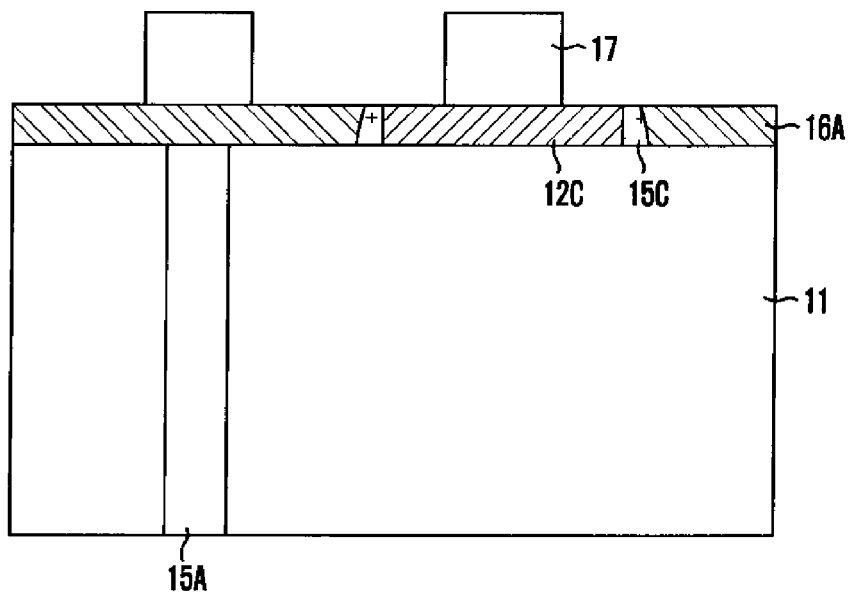

Referring to FIG. 1F, a planarization process, e.g. a chemical mechanical polishing (CMP), is performed to expose the polysilicon fuse 12B and planarize the metal layer 16. After the planarization process, a polysilicon fuse pattern 12C and a metal pattern 16A having the same height is formed. A third photoresist pattern 17 is formed over the planarized resultant structure to form the metal line. The third photoresist pattern 17 covers the polysilicon fuse pattern 12C in order to protect the polysilicon fuse 12C. As shown, edges of the polysilicon fuse pattern 12C are exposed except a region that is exposed to the laser beam, i.e., a region for a fuse box. Since the edges of the polysilicon fuse pattern 12C is exposed, resistance of the edges of the polysilicon fuse pattern 12C increases compared to a central portion during a subsequent etch or an ion implantation process. In this case, since energy of the laser beam irradiated during the subsequent repair process is focused on the central portion of the polysilicon fuse pattern 12C, the fuse blowing can be stably performed.

Figure 1G:
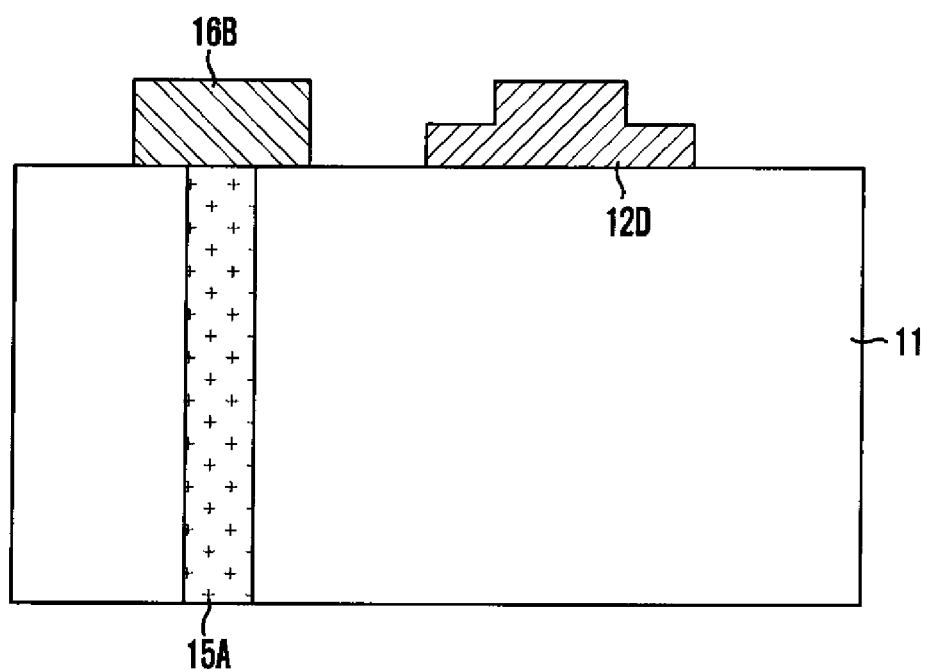

Referring to FIG. 1G, the metal pattern 16A is etched using the third photoresist pattern 17 as an etch barrier to form a first metal line 16B connected to the first metal contact 15A. When the metal pattern 16A is etched, a spacer-shaped remaining conductive pattern 15C on sidewalls of the polysilicon fuse pattern 12C can be removed. Furthermore, the exposed edges of the polysilicon fuse pattern 12C are etched to a predetermined depth. Thus, a remaining polysilicon fuse pattern 12D is formed to have a protruded center portion. The edges of the remaining polysilicon fuse pattern 12D have a higher resistance than the center portion thereof.

In the embodiments of the present invention, the edges of the polysilicon fuse pattern 12C are etched. However, the edges of the polysilicon fuse pattern 12C may not be etched according to a condition for the etch of the metal layer 16. In this case, ions are implanted into the exposed polysilicon fuse pattern 12C etched using the third photoresist pattern 17 as an etch barrier to increase the resistance of the edges of the polysilicon fuse pattern 12C. The ion implantation process may be performed using oxygen ($O_2$).

The ion implantation process can be additionally performed even though the edges of the polysilicon fuse pattern 12C are etched. That is, the ions are selectively implanted into the edges of the remaining polysilicon fuse pattern 12D. Thus, the resistance of the edges of the remaining polysilicon fuse pattern 12D increases.

The remaining first metal pattern 16B and the remaining polysilicon fuse pattern 12D are formed over a single layer. Thus, an etch process for forming the subsequent fuse box can be easily performed. The remaining first metal pattern 16B and the remaining polysilicon fuse pattern 12D both include only polysilicon even though they are formed over a single layer. Thus, a range of the thickness (Rox) of the insulation layer remaining on the fuse increases to easily perform the etch process for forming the fuse box and to stably perform the fuse blowing.

Figure 1H:
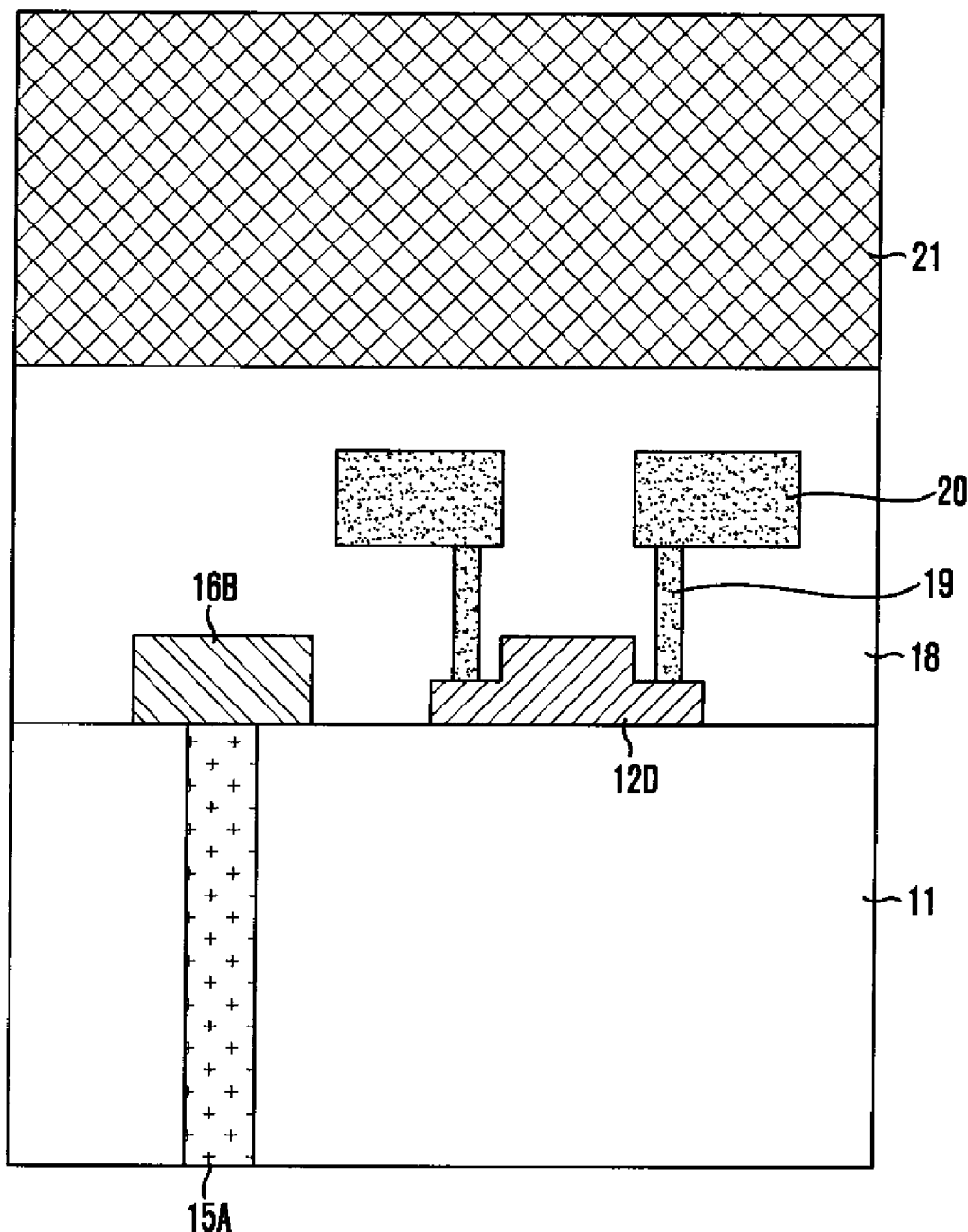

Referring to FIG. 1H, a second insulation layer 18 is formed to cover the first metal pattern 16B and the remaining polysilicon fuse pattern 12D. The second insulation layer 18 can employ a guard ring including a second metal contact 19 and a second metal line 20 therein. The guard ring surrounds the region for the fuse box formed by the aforementioned method. Although not shown, the second insulation layer 18 may further include a third metal contact and a third metal line can be additionally formed over the second metal line 20. The second insulation layer 18 preferably includes an oxide layer. A passivation layer 21 is formed over the second insulation layer 18.

Figure 1I:
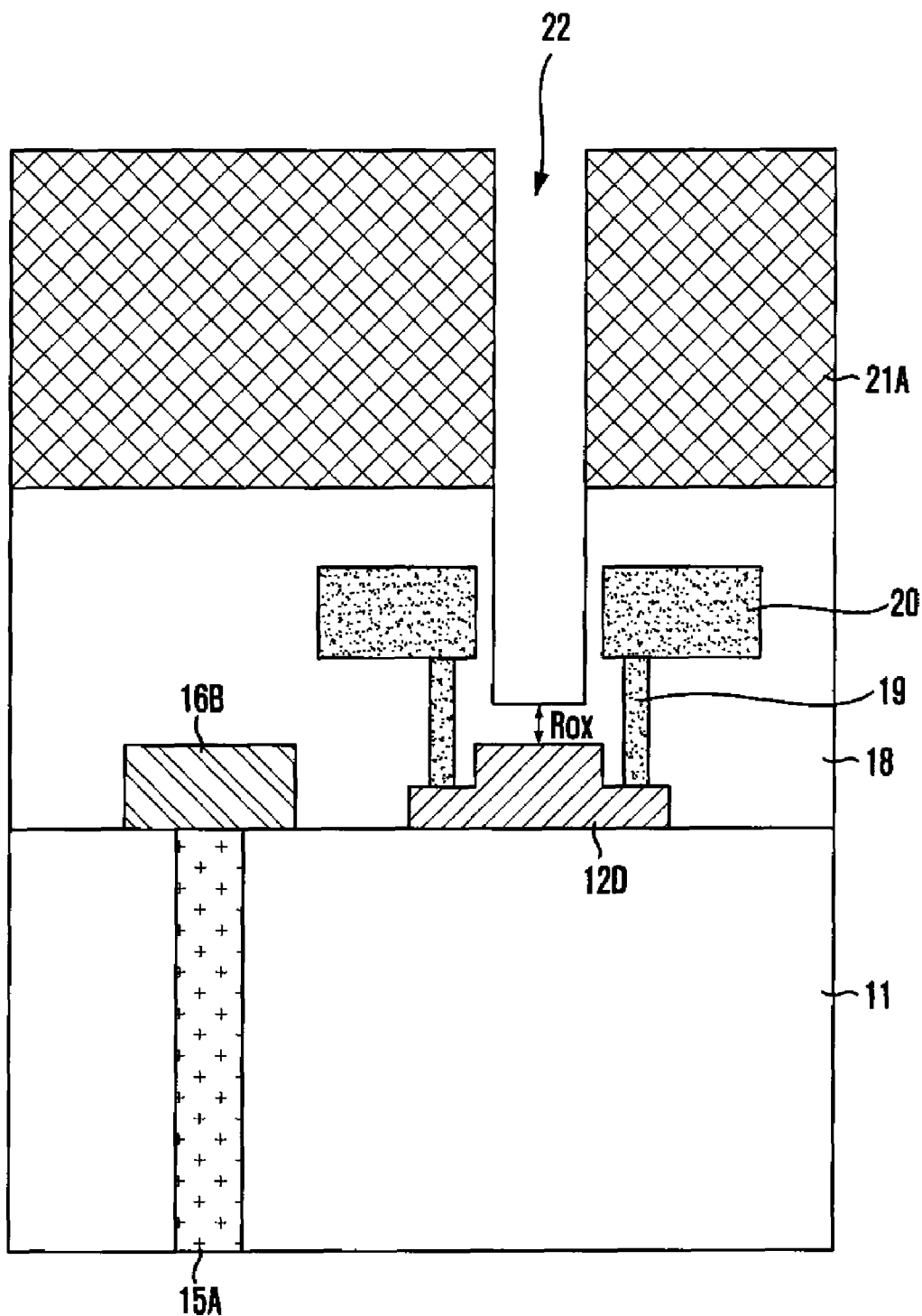

Referring to FIG. 1I, a mask (not shown) for forming the fuse box is formed over the passivation layer 21. The passivation layer 21 and the second insulation layer 18 are etched using this mask as an etch barrier. The etch process is performed until the second insulation layer 18 having a desired thickness (Rox) remains on the center portion of the remaining polysilicon fuse pattern 12D. Thus, a fuse box 22 is formed.

Although not shown, a polyimide is formed over a resultant structure to protect a chip from external moisture and dust during the subsequent process, e.g., the packaging process. A lower surface of the fuse box 22 is exposed to have one portion of the polyimide remain on sidewalls of the fuse box 22 by removing the other portion of the polyimide. Then, the fuse unit formation process is completed.

The polysilicon fuse according to the embodiments of the present invention is disposed on the layer with the metal line thereon. Thus, the etch process for forming the fuse box can be easily performed. Furthermore, since the fuse includes only polysilicon, the thickness of the insulation layer remaining on the fuse increases and the fuse blowing can be easily performed. Particularly, during the mask process for forming the metal line, the edges of the polysilicon fuse are exposed and then etched or ion implanted. Thus, the resistance of the edges of the fuse increases compared to the center portion to easily perform the fuse blowing.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a semiconductor with a fuse, the method comprising:
   providing a substrate;
   forming an insulation layer over the substrate;
   forming a polysilicon hard mask over the insulation layer;
   forming a first mask pattern over the polysilicon hard mask;
   forming a metal contact hole by selectively etching the insulation layer using the polysilicon hard mask after the first mask pattern is formed;
   forming a metal contact by filling a conductive material into the metal contact hole; and
   removing the polysilicon hard mask exposed by the first mask pattern to form a portion of the polysilicon hard mask into a polysilicon fuse.

2. The method of claim 1, after forming the polysilicon fuse, further comprising:
   forming a metal layer for a metal line over a resultant structure including the polysilicon fuse;
   performing a planarization process to expose the polysilicon fuse;
   forming a second mask pattern for forming a metal line over a planarized resultant structure, wherein the second mask pattern covers the polysilicon fuse; and
   etching the metal layer by using the second mask pattern as an etch barrier to form a metal line disposed on a layer, wherein a height of the metal line is the same as that of the polysilicon fuse disposed on the same said layer.

3. The method of claim 2, wherein the second mask pattern is formed to cover the polysilicon fuse in a region for a fuse box, leaving edges of the polysilicon fuse exposed.

4. The method of claim 3, after forming the second mask pattern, further comprising:
   etching the edges of the polysilicon fuse exposed by the second mask pattern to a predetermined depth.

5. The method of claim 3, after forming the second mask pattern, further comprising:
   performing an ion implantation process on the edges of the polysilicon fuse exposed by the second mask pattern to increase resistance.

6. The method of claim 4, after etching the edges of the polysilicon fuse to a predetermined depth, further comprising:
   performing an ion implantation process on the edges of the polysilicon fuse etched to said predetermined-depth.

7. The method of claim 5, wherein the ion implantation process is performed using oxygen ($O_2$).

8. The method of claim 2, wherein forming the metal layer is performed to have a thickness thinner than a thickness of the polysilicon fuse.

9. The method of claim 2, wherein the metal line is electrically connected to the metal contact.

10. The method of claim 1, after forming the polysilicon fuse, further comprising:
    forming an insulation layer and a passivation layer over a resultant structure including the polysilicon fuse; and
    forming a fuse box by selectively etching the passivation layer and the insulation layer until the insulation layer has a desired thickness.

* * * * *